(12) United States Patent
Takizawa

(10) Patent No.: US 7,109,096 B2
(45) Date of Patent: Sep. 19, 2006

(54) SEMICONDUCTOR DEVICE AND METHOD OF MANUFACTURING THE SAME

(75) Inventor: Teruo Takizawa, Matsumoto (JP)

(73) Assignee: Seiko Epson Corporation, Tokyo (JP)

( * ) Notice: Subject to any disclaimer, the term of this patent is extended or adjusted under 35 U.S.C. 154(b) by 132 days.

(21) Appl. No.: 10/775,146

(22) Filed: Feb. 11, 2004

(65) Prior Publication Data

US 2004/0217393 A1 Nov. 4, 2004

(30) Foreign Application Priority Data

Mar. 17, 2003 (JP) .............................. 2003-071955

(51) Int. Cl.
*H01L 29/161* (2006.01)
*H01L 21/324* (2006.01)

(52) U.S. Cl. ................ 438/479; 438/938; 257/E29.193

(58) Field of Classification Search ................ 438/481, 438/509, 938; 257/616, E29.193
See application file for complete search history.

(56) References Cited

U.S. PATENT DOCUMENTS

| 5,413,679 | A | 5/1995 | Godbey | |
|---|---|---|---|---|
| 6,200,866 | B1 * | 3/2001 | Ma et al. ..................... | 438/299 |
| 6,723,541 | B1 | 4/2004 | Sugii et al. | |
| 6,750,486 | B1 * | 6/2004 | Sugawara et al. .......... | 257/265 |
| 6,774,015 | B1 * | 8/2004 | Cohen et al. ............... | 438/479 |
| 2002/0140031 | A1 * | 10/2002 | Rim ........................... | 257/347 |
| 2002/0168802 | A1 * | 11/2002 | Hsu et al. ................... | 438/149 |
| 2003/0077882 | A1 * | 4/2003 | Shih et al. .................. | 438/478 |
| 2003/0232467 | A1 | 12/2003 | Anderson et al. | |
| 2004/0087114 | A1 | 5/2004 | Xiang et al. | |
| 2004/0094763 | A1 * | 5/2004 | Agnello et al. ............... | 257/55 |

FOREIGN PATENT DOCUMENTS

| JP | A 9-321307 | 12/1997 |
| JP | 2000203023 A | * 7/2000 |
| JP | 2001284558 A | * 10/2001 |
| JP | A 2003-282932 | 10/2003 |

OTHER PUBLICATIONS

M. J. Clugston, "The New Penguin Dictionary of Science," definition entry for the term "annealing", 1998.*
Huang, F.Y., "Effect of strain transfer on critical thickness for epitaxial layers grown on compliant substrate," May 22, 2000, Applied Physics Letters, vol. 76, No. 21, pp. 3046-3048.*

* cited by examiner

*Primary Examiner*—Carl Whitehead, Jr.
*Assistant Examiner*—Jennifer M. Dolan
(74) *Attorney, Agent, or Firm*—Oliff & Berridge, PLC

(57) ABSTRACT

A method of manufacturing a semiconductor device including: providing a substrate having an insulating layer and a single crystal silicon layer formed on the insulating layer; forming a strain-inducing semiconductor layer on the single crystal silicon layer, the strain-inducing semiconductor having the lattice constant differing from the lattice constant of the single crystal silicon layer; changing the single crystal silicon layer into a strained silicon layer by matching a lattice of the single crystal silicon layer with a lattice of the strain-inducing semiconductor layer; and removing the strain-inducing semiconductor layer.

7 Claims, 3 Drawing Sheets

SEMICONDUCTOR DEVICE AND METHOD OF MANUFACTURING THE SAME

Japanese Patent Application No. 2003-71955, filed on Mar. 17, 2003, is hereby incorporated by reference in its entirety.

BACKGROUND OF THE INVENTION

The present invention relates to a semiconductor device which includes a semiconductor element having a strained silicon layer and a method of manufacturing such a semiconductor device.

Accompanied by reduction of size and an increase in speed of semiconductor devices in recent years, a substrate including a strained silicon layer has attracted attention as a substrate for forming a high-speed and low-power-consumption semiconductor device. A strained silicon layer is obtained by causing a layer of silicon (Si) and germanium (Ge) (SiGe layer) to grow on a silicon substrate, and causing a single crystal silicon layer to grow on the SiGe layer. The band structure changes in such a strained silicon layer. As a result, electron scattering is limited due to removal of degeneracy, whereby electron mobility can be increased.

A silicon-on-insulator (SOI) substrate including a buried oxide film in a silicon substrate has also attracted attention as a substrate for forming a high-speed and low-power-consumption semiconductor device, and has been put into practical use. In recent years, a technology of forming an SOI structure including a strained silicon layer has been proposed in order to deal with a demand for a further reduction of size and increase in speed of semiconductor devices (see Japanese Patent Application Laid-open No. 9-321307).

In the case of forming an SOI substrate including a strained silicon layer as described above, a silicon-germanium mixed crystal layer is formed on a semiconductor layer of the SOI substrate. A single crystal silicon layer is then formed on the silicon-germanium mixed crystal layer to obtain a strained silicon layer. In this method, there may be a case where a silicon-germanium layer in which a misfit dislocation or a threading dislocation occurs is formed due to a lattice matching between the semiconductor layer of the SOI substrate and the silicon-germanium mixed crystal layer. If the strained silicon layer is formed on the silicon-germanium mixed crystal layer having such a dislocation defect, the defect is introduced into the strained silicon layer, whereby an excellent field effect transistor cannot be formed. Therefore, it is necessary to form a silicon-germanium mixed crystal layer having a large thickness, whereby a considerable time is necessary for the crystal growth of the silicon-germanium mixed crystal layer.

In order to obtain effects of the SOI substrate such as reduction of the parasitic capacitance, the thickness of the SOI layer of the SOI substrate must be equal to or less than the diffusion depth of the source/drain region of the field effect transistor. However, if the strained silicon layer is formed after forming a silicon-germanium mixed crystal layer having a large thickness, the effects of the SOI substrate cannot be achieved. In the case of using a step of injecting a high concentration of oxygen ions, the strained silicon layer is damaged to a large extent.

BRIEF SUMMARY OF THE INVENTION

The present invention may provide a semiconductor device having an SOI structure including a strained silicon layer which is damaged only to a small extent by simplified steps, and a method of manufacturing the semiconductor device.

According to one aspect of the present invention, there is provided a method of manufacturing a semiconductor device comprising:

providing a substrate having an insulating layer and a single crystal silicon layer formed on the insulating layer;

forming a strain-inducing semiconductor layer on the single crystal silicon layer, the strain-inducing semiconductor having the lattice constant differing from the lattice constant of the single crystal silicon layer;

changing the single crystal silicon layer into a strained silicon layer by matching a lattice of the single crystal silicon layer with a lattice of the strain-inducing semiconductor layer; and removing the strain-inducing semiconductor layer.

According to another aspect of the present invention, there is provided a semiconductor device comprising a semiconductor substrate manufactured by the above method of manufacturing a semiconductor device.

According to a further aspect of the present invention, there is provided a semiconductor device comprising:

a semiconductor substrate which includes an insulating layer and a strained silicon layer formed on the insulating layer; and a field effect transistor formed on the semiconductor substrate.

DETAILED DESCRIPTION OF THE EMBODIMENT

Figure 1:
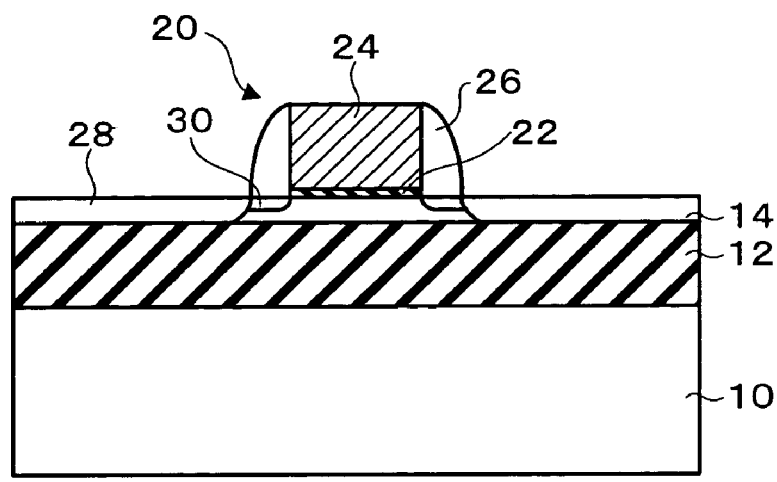
FIG. 1 is a cross-sectional view schematically showing a semiconductor device according to one embodiment of the present invention.

Embodiments according to the present invention will be described below.

(1) According to one embodiment of the present invention, there is provided a method of manufacturing a semiconductor device comprising:

providing a substrate having an insulating layer and a single crystal silicon layer formed on the insulating layer;

forming a strain-inducing semiconductor layer on the single crystal silicon layer, the strain-inducing semiconductor having the lattice constant differing from the lattice constant of the single crystal silicon layer;

changing the single crystal silicon layer into a strained silicon layer by matching a lattice of the single crystal silicon layer with a lattice of the strain-inducing semiconductor layer; and removing the strain-inducing semiconductor layer.

In this method of manufacturing a semiconductor device, the strained silicon layer can be formed by forming the strain-inducing semiconductor layer on the single crystal silicon layer, and inducing a lattice relaxation so that the lattice of the single crystal silicon layer matches with the lattice of the strain-inducing semiconductor layer. Specifically, the single crystal silicon layer is lattice-relaxed to match with the lattice constant of the strain-inducing semiconductor layer by performing a lattice relaxation inducing treatment after forming the strain-inducing semiconductor layer on the single crystal silicon layer, whereby the single crystal layer is changed into a strained silicon layer. In the technology described in the section of the background art, a strained silicon layer is obtained by forming a silicon layer on a silicon-germanium mixed crystal layer (or a strain-inducing semiconductor layer) having a larger thickness. However, according to the present invention, an SOI substrate including a strained silicon layer can be formed by more simplified steps without forming such a thick strain-inducing semiconductor layer. Moreover, since a strained silicon layer with less thickness can be obtained, effects characteristic of the SOI substrate, such as reduction of the parasitic capacitance, can be achieved, whereby a semiconductor device having excellent characteristics can be manufactured.

In this method of manufacturing a semiconductor device, the step of forming the strained silicon layer may be performed by providing an annealing process.

In this method of manufacturing a semiconductor device, when a single crystal silicon layer is formed on the strain-inducing semiconductor layer, the single crystal silicon layer on the strain-inducing semiconductor layer may have a thickness which causes no defect. This makes it possible to form a strained silicon layer which is excellently lattice-relaxed.

In this method of manufacturing a semiconductor device, a layer including germanium may be formed as the strain-inducing semiconductor layer by using an epitaxial growth method. This makes it possible to form an excellent strain-inducing semiconductor layer.

In this method of manufacturing a semiconductor device, the strain-inducing semiconductor layer may be removed by wet etching using mixed acid of hydrofluoric acid and nitric acid. This makes it possible to prevent a damage caused by plasma or the like more effectively than the case of selectively etching germanium by dry etching or the like.

In this method of manufacturing a semiconductor device, the step of forming the strain-inducing semiconductor layer may be performed by using a metal organic chemical vapor deposition method, a molecular beam epitaxy method, or a ultra high vacuum chemical vapor deposition method.

In this method of manufacturing a semiconductor device, the annealing process may be performed through a temperature increase process, a constant temperature process, and a temperature decrease process.

(2) According to another embodiment of the present invention, there is provided a semiconductor device comprising a semiconductor substrate manufactured by the above method of manufacturing a semiconductor device. A semiconductor device which implements an increase in operating speed in the case of using a strained silicon layer as a channel semiconductor layer can be thus provided.

(3) According to a further embodiment of the present invention, there is provided a semiconductor device comprising: a semiconductor substrate which includes an insulating layer and a strained silicon layer formed on the insulating layer; and a field effect transistor formed on the semiconductor substrate. A semiconductor device in which an increase in operating speed and development of fine structure are implemented can be thus provided.

The semiconductor device according to these embodiments of the present invention will be described below in more detail with reference to the drawings.

1. Semiconductor Device

FIG. 1 is a cross-sectional view schematically showing a semiconductor device according to the present embodiment.

The semiconductor device according to the present embodiment has a silicon-on-insulator (SOI) structure, in which a MOS transistor 20 is formed on an SOI substrate 100. The SOI substrate 100 has a structure in which an insulating layer (silicon oxide layer) 12 and a strained silicon layer 14 are stacked on a support substrate 10. The strained silicon layer 14 is a lattice-relaxed layer and has a thickness of 1 to 10 nm.

A gate insulating layer 22 and a gate electrode 24 of the MOS transistor 20 are formed on the strained silicon layer 14. A sidewall insulating layer 26 is formed on each side of the gate insulating layer 22 and the gate electrode 24. A source/drain region 28 is formed of an impurity layer in a semiconductor layer 10c on the side of the sidewall insulating layer 26. An extension region 30 is formed in the semiconductor layer under the sidewall insulating layer 26.

2. Method of Manufacturing Semiconductor Device

Figure 2:
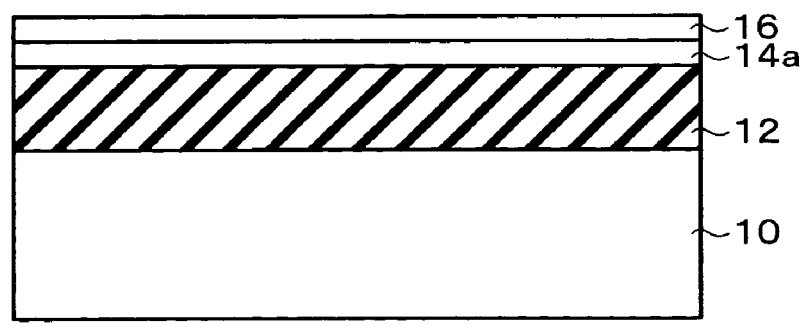
FIG. 2 is a cross-sectional view showing a step of manufacturing a semiconductor device according to one embodiment of the present invention.
Figure 3A:
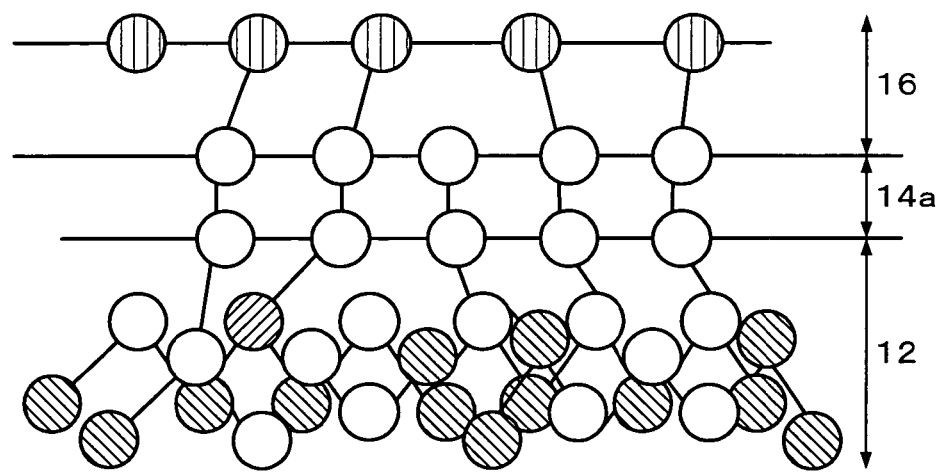
FIGS. 3A and 3B are diagrams showing lattice matching between a single crystal silicon layer and a strain-inducing semiconductor layer.
Figure 3B:
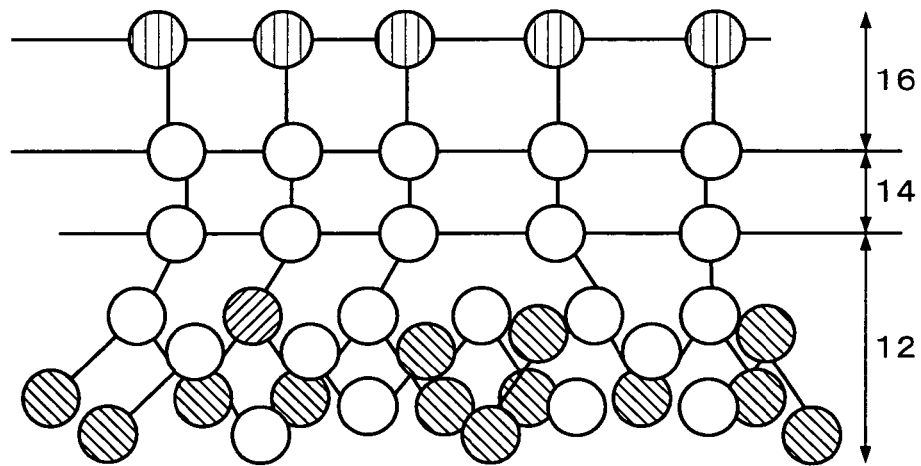
Figure 4:
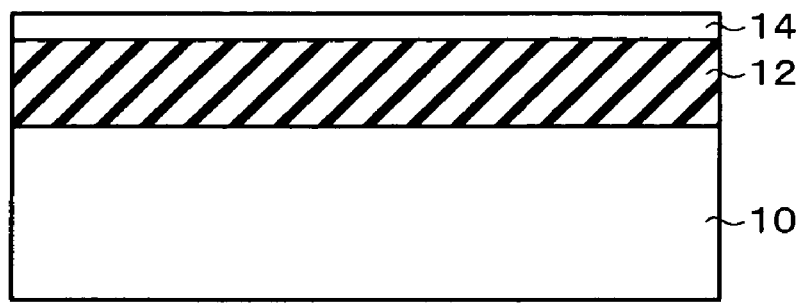
FIG. 4 is a cross-sectional view showing another step of manufacturing a semiconductor device according to one embodiment of the present invention.

FIGS. 2 to 4 are cross-sectional views schematically showing manufacturing steps of the semiconductor device of the present embodiment.

As shown in FIG. 2, an SOI substrate in which the insulating layer 12 and a semiconductor layer are stacked on the support substrate 10 is provided. A single crystal silicon layer 14a is used as the semiconductor layer. The single crystal silicon layer 14a has a thickness which allows a strain-inducing semiconductor layer 16 to be formed on the single crystal silicon layer 14a in a step described later in a state in which no defect occurs in the strain-inducing semiconductor layer 16. In the case of using a silicon-germanium mixed crystal layer as the strain-inducing semiconductor layer 16, the thickness of the single crystal silicon layer 14a may be 1 to 10 nm. If the thickness of the single crystal silicon layer 14a is less than 1 nm, it is difficult to form a semiconductor element in which a strained silicon layer formed later is used as a channel semiconductor layer. If the thickness of the single crystal silicon layer 14a exceeds 10 nm, the single crystal silicon layer 14a cannot be lattice-matched with the strain-inducing semiconductor layer 16 in a step described later in a state in which no defect occurs.

The strain-inducing semiconductor layer 16 is formed on the single crystal silicon layer 14a by using an epitaxial growth method. As the strain-inducing semiconductor layer 16, a semiconductor layer having a lattice constant differing from the lattice constant of the single crystal silicon layer 14a may be used. For example, a germanium layer, a silicon-germanium mixed crystal layer, a stacked film of these layers, or the like may be used.

As examples of the method of forming the strain-inducing semiconductor layer 16, an epitaxial growth method such as a metal organic chemical vapor deposition (MO-CVD) method, a molecular beam epitaxy (MBE) method, a ultra high vacuum chemical vapor deposition (UHV-CVD) method, or a liquid phase growth method such as a liquid phase epitaxy (LPE) method can be given.

As the Si raw material, $SiH_4$, $Si_2H_6$, $Si_2H_4Cl_2$, or the like is suitable. As the Ge raw material, $GeH_4$, $GeF_4$, $Ge_2H_8$, or the like is suitable.

The SOI substrate is subjected to an annealing process in order to induce a lattice relaxation of the single crystal silicon layer 14a to obtain the strained silicon layer 14. The lattice relaxation state of the single crystal silicon layer 14a is described below with reference to FIGS. 3A and 3B. The lattice constant of germanium (5.64 Å) which makes up the strain-inducing semiconductor layer 16 differs from the lattice constant of the single crystal silicon thin film (5.43 Å). Therefore, after the strain-inducing semiconductor layer 16 is deposited on the single crystal silicon layer 14a, a lattice mismatch occurs between the single crystal silicon layer 14a and the strain-inducing semiconductor layer 16 as shown in FIG. 3A, whereby a stress is generated in each film. As shown in FIG. 3B, the Si—Si bond or the Si—O bond of the single crystal silicon layer 14a is cut by providing the annealing process, whereby the strained silicon layer 14 lattice-matched with the strain-inducing semiconductor layer 16 is formed. The annealing process is performed at a temperature of 1000° C. or more. The annealing process is performed for a period of time until the single crystal silicon layer 14a is lattice-matched to obtain the strained silicon layer 14. The annealing process time is appropriately changed depending on the thickness of the single crystal silicon layer 14a. The annealing process is performed through a temperature increase process, a constant temperature process, and a temperature decrease process. This series of heating step may be repeatedly performed a plurality of times.

As shown in FIG. 4, the strain-inducing semiconductor layer 16 is removed. The strain-inducing semiconductor layer 16 may be removed by using a conventional etching technology such as wet etching or dry etching. It is preferable to remove the strain-inducing semiconductor layer 16 by wet etching using mixed acid of hydrofluoric acid and nitric acid. In this case, damage applied to the semiconductor layer 14 can be reduced in comparison with the case of dry etching the strain-inducing semiconductor layer 16. The SOI substrate 100 including the strained silicon layer 14 can be formed by these steps.

As shown in FIG. 1, the MOS transistor 20 is formed on the SOI substrate 100 of the present embodiment. The MOS transistor 20 may be formed by using a known MOS transistor formation process. An example of the formation process is described below.

An element isolation (not shown) is formed by using a conventional technology in order to separate the formation region of the MOS transistor 20 from other regions. The gate insulating layer 22 is formed on the strained silicon layer 14 separated by the element isolation. The gate insulating layer 22 is formed by using a thermal oxidation method, for example. A channel region is formed by injecting impurity ions for adjusting the threshold voltage through the gate insulating layer 22.

A polycrystalline silicon film which becomes the gate electrode 24 is formed on the gate insulating layer 22 by using a reduced pressure CVD method. The gate electrode 24 is then formed by patterning the polycrystalline silicon film by anisotropic etching such as reactive ion etching (RIE).

After selectively injecting impurity ions of given conductivity type using the gate electrode 24 as a mask, the extension region 30 consisting of a low-concentration impurity layer is formed in a self-aligned manner. An annealing treatment may optionally be performed in this step.

After forming an insulating layer (not shown) such as a silicon oxide film or a silicon nitride film over the entire surface by using a CVD method, the sidewall insulating layers 26 are formed on the side surfaces of the gate insulating layer 22 and the gate electrode 24 by etching back the insulating layer. The source/drain regions 28 are formed in a self-aligned manner by injecting impurity ions of given conductivity type using the sidewall insulating layers 26 as a mask. The MOS transistor 20 is formed in this manner, whereby the semiconductor device according to the present embodiment is manufactured.

According to the method of manufacturing a semiconductor device of the present invention, a strained silicon layer can be formed by forming a strain-inducing semiconductor layer on a single crystal silicon layer, and inducing a lattice relaxation of the single crystal silicon layer. Specifically, the single crystal silicon layer is lattice-relaxed to match with the lattice constant of the strain-inducing semiconductor layer formed thereon, whereby a strained silicon layer is obtained. In the technology described in the section of the background art, a strained silicon layer is obtained by inducing a lattice relaxation after forming a silicon layer on a silicon-germanium mixed crystal layer (strain-inducing semiconductor layer) having a large thickness. On the contrary, according to the present invention, it is unnecessary to form a strain-inducing semiconductor layer having a large thickness, whereby an SOI substrate including a strained silicon layer can be formed by using more simplified steps. Moreover, since a strained silicon layer having a small thickness can be obtained, effects characteristic of the SOI substrate, such as reduction of the parasitic capacitance, can be achieved, whereby a semiconductor device having excellent characteristics can be manufactured. This enables a field effect transistor having expected device characteristics to be realized, even if scaling down of the transistor progresses.

The present invention is not limited to the above-described embodiment. The above-described embodiment illustrates the case where a silicon-germanium mixed crystal layer is used as the strain-inducing semiconductor layer. However, a mixed crystal layer of materials having different lattice constants, such as a mixed crystal layer of Si and another element such as SiC and SiN, a II–VI group mixed crystal layer such as a ZnSe layer, or a III–V group mixed crystal layer such as GaAs or InP, may be used instead of the silicon-germanium mixed crystal layer.

The above-described embodiment illustrates the case of forming a MOS transistor. However, the present invention can also be applied to any semiconductor device including a strained silicon layer as a channel semiconductor layer.

What is claimed is:

1. A method of manufacturing a semiconductor device comprising:
   providing a substrate having an insulating layer and a single crystal silicon layer formed on the insulating layer;
   forming a strain-inducing semiconductor layer on the single crystal silicon layer, the strain-inducing semiconductor having a lattice constant differing from a lattice constant of the single crystal silicon layer;
   matching a lattice of the single crystal silicon layer with a lattice of the strain-inducing semiconductor layer and changing the single crystal silicon layer into a strained silicon layer, by providing an annealing process with respect to the single crystal silicon layer and the strain-inducing semiconductor layer without performing ion implantation in the single crystal silicon layer and the strain-inducting semiconductor layer; and
   removing the strain-inducing semiconductor layer.

2. The method of manufacturing a semiconductor device as defined in claim 1,
   wherein the single crystal silicon layer is provided with the strain-inducing semiconductor layer formed thereon, wherein the single crystal silicon layer has a thickness such that no defect occurs in the strain-inducing semiconductor layer.

3. The method of manufacturing a semiconductor device as defined in claim 1,
wherein a layer including germanium is formed as the strain-inducing semiconductor layer.

4. The method of manufacturing a semiconductor device as defined in claim 1,
wherein the strain-inducing semiconductor layer is removed by wet etching using mixed acid of hydrofluoric acid and nitric acid.

5. The method of manufacturing a semiconductor device as defined in claim 1,
wherein the step of forming the strain-inducing semiconductor layer is performed by using a metal organic chemical vapor deposition method, a molecular beam epitaxy method, or a ultra high vacuum chemical vapor deposition method.

6. The method of manufacturing a semiconductor device as defined in claim 1,
wherein the annealing process is performed through a temperature increase process, a constant temperature process, and a temperature decrease process.

7. A method of manufacturing a semiconductor device comprising:
providing a substrate having an insulating layer and a single crystal silicon layer formed on the insulating layer;
forming a strain-inducing semiconductor layer on the single crystal silicon layer, the strain-inducing semiconductor having a lattice constant differing from a lattice constant of the single crystal silicon layer;
changing the single crystal silicon layer into a strained silicon layer, by cutting a Si—Si bond of the single crystal silicon layer through providing an annealing process and matching a lattice of the single crystal silicon layer with a lattice of the strain-inducing semiconductor layer; and
removing the strain-inducing semiconductor layer.

* * * * *